United States Patent [19]

Hasegawa et al.

[11] 4,171,977

[45] Oct. 23, 1979

[54] PHOTOPOLYMERIZABLE COMPOSITION WITH EPOXY STABILIZERS

[75] Inventors: Eiichi Hasegawa; Kenichiro Yazawa; Shigeo Tanaka; Masataka Murata; Yohonosuke Takahashi, all of Asaka, Japan

[73] Assignee: Fuji Photo Film Co., Ltd., Minami-ashigara, Japan

[21] Appl. No.: 824,195

[22] Filed: Aug. 12, 1977

[30] Foreign Application Priority Data

Aug. 12, 1976 [JP] Japan .................................. 51-96674

[51] Int. Cl.$^2$ .............................................. G03C 1/68
[52] U.S. Cl. ............................ 96/115 P; 204/159.18; 204/159.23; 96/115 R
[58] Field of Search ...................... 96/115 P, 115 R; 204/159.18, 159.23

[56] References Cited

U.S. PATENT DOCUMENTS

| 3,816,278 | 6/1974 | Watt | 96/115 P |
| 3,817,845 | 6/1974 | Feinberg | 96/115 P |
| 3,870,524 | 3/1975 | Watanabe et al. | 96/115 P |
| 4,058,398 | 11/1977 | Osada et al. | 96/115 P |
| 4,058,443 | 11/1977 | Murata et al. | 96/115 P |

*Primary Examiner*—Jack P. Brammer
*Attorney, Agent, or Firm*—Sughrue, Rothwell, Mion, Zinn and Macpeak

[57] ABSTRACT

A photopolymerizable composition having improved thermal stability comprising (a) a polymerizable ethylenically unsaturated monomer, (b) an initiator represented by the general formula (I):

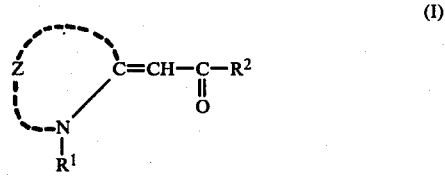

wherein Z represents the non-metallic atoms necessary to complete a nitrogen-containing heterocyclic nucleus; $R^1$ represents an unsubstituted or substituted alkyl group; and $R^2$ represents an unsubstituted or substituted alkyl group, an unsubstituted or substituted aryl group, or a thienyl group; and (c) a chlorinated polyolefin as a binder and additionally containing (d) about 1 to about 30% by weight of an epoxy compound.

10 Claims, No Drawings

PHOTOPOLYMERIZABLE COMPOSITION WITH EPOXY STABILIZERS

BACKGROUND OF THE INVENTION

1. Field of the Invention

This invention relates to a photopolymerizable composition comprising a polymerizable ethylenically unsaturated monomer, a photopolymerization initiator, a chlorinated polyolefin and a compound containing at least one epoxy group, and, in particular, to such a composition which has an improved stability unaccompanied by any decrease in photographic speed.

2. Description of the Prior Art

Many techniques are known to suppress thermal polymerization of a composition containing a polymerizable ethylenically unsaturated monomer. For example, various thermal polymerization inhibitors including hydroquinone, p-methoxyphenol, pyrogallol, chloranil, cuprous chloride, etc., are disclosed in Japanese Patent Publication Nos. 23761/1961, 18979/1962, 15932/1966 (corresponding to U.S. Pat. No. 3,261,686) and 43126/1973 (corresponding to U.S. Pat. No. 3,645,730).

Unfortunately, however, in photopolymerizable compositions comprising (a) an ethylenically unsaturated monomer, (b) a photopolymerization initiator represented by the general formula (I) described below and (c) a chlorinated polyolefin, it has been found that thermal polymerization is not suppressed to a satisfactory extent when one of these thermal polymerization inhibitors is used. Use of two or more thermal polymerization inhibitors and increasing the amount of the thermal polymerization inhibitors were investigated, and no desirable effect was found.

It should be noted that the use of an excess amount of the thermal polymerization inhibitor undesirably suppresses the photopolymerization of the above-described photopolymerizable composition, practically requiring a noticeable extension of exposure time to actinic radiation in the image reproduction process. This effect obviously imposes a severe restriction on the amount of thermal polymerization inhibitor which can be used. Japanese Patent Application (OPI) No. 94788/1973 discloses a method which utilizes a specialized initiator in order to improve the stability at elevated temperatures in the case of the above-described photopolymerizable composition. However, the nitroacenaphthene and nitrofluorenone compounds disclosed therein proved to exhibit insufficient activity for the initiation of photopolymerization.

SUMMARY OF THE INVENTION

Improvement in the thermal stability of the above-described photopolymerizable composition which differs from conventional systems in many respects was rather difficult to achieve, but after extensive study, a method overcoming this difficulty has been found. In these investigations it has been found that the chlorinated polyolefin in the above-described photopolymerizable composition slowly decomposes during storage to promote a polymerization reaction of the ethylenically unsaturated monomer in the dark and that this reaction is accelerated upon heating. In order to avoid this dark reaction it has been found quite effective to incorporate an epoxy compound (containing at least one epoxy oxygen atom) in an amount of from about 1 to about 30% by weight, and more preferably from 5 to 15% by weight, in the above-described photopolymerizable composition. Thus the composition is remarkably stabilized against dark reaction particularly at elevated temperature, i.e., at up to about 100° C. for a short period of time of up to about 20 minutes, or at up to about 80° C., preferably up to 70° C. for a long period of time of about 20 minutes to several months.

One object of the present invention is to improve the stability of a photopolymerizable composition comprising the above-described components (a), (b) and (c) in the form of a solution or a coated film by the use of epoxy compounds.

Another object of the present invention is to improve the stability of the above-described photopolymerizable composition without decreasing the photographic speed of the compositions.

Accordingly the present invention provides a photopolymerizable composition which comprises (a) a polymerizable ethylenically unsaturated monomer; (b) a photopolymerization initiator represented by the following general formula (I):

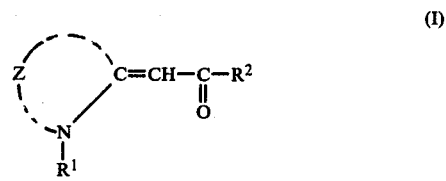

wherein Z represents the non-metallic atoms necessary to complete a nitrogen-containing heterocyclic nucleus; $R^1$ represents an unsubstituted or substituted alkyl group; and $R^2$ represents an unsubstituted or substituted alkyl group, an unsubstituted or substituted aryl group or a thienyl group; (c) a chlorinated polyolefin as a binder, and further (d) about 1 to about 30% by weight of a compound having at least one epoxy group as a thermal stabilizer.

DETAILED DESCRIPTION OF THE INVENTION

A detailed explanation is given below as to the main components used in the present invention. First of all, suitable epoxy compounds which can be used as component (d) include those which are extensively used as stabilizers or plasticizers for polyvinyl chloride. Suitable examples include epoxidized aliphatic monoesters such as, for example, the epoxidized derivatives of alkyl oleates (e.g., methyl oleate, butyl oleate, octyl oleate, etc.) having the formula:

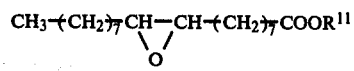

wherein $R^{11}$ is an alkyl group having up to 10 carbon atoms, which can be obtained from soybean oil or beef tallow (commercially available products include Epocizer, produced by Dai-Nippon Ink Chem. Ind.); and the polyglycidyl ethers of polyhydric alcohols (e.g., trimethylolpropane, pentaerythritol, sorbitol, glycerol, triethylene glycol, polyethylene glycol, etc.) having the formula:

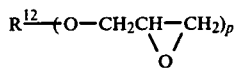

wherein p is an integer of 2 to 6, and $R^{12}$ is a divalent to hexavalent residue of a polyol (commercially available products include Epiol G-100, produced by Nippon Oils & Fats Co.). Further, epoxidized triglycerides having the formula:

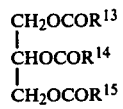

wherein $R^{13}$, $R^{14}$ and $R^{15}$, which may be the same or different, are each an epoxidized alkyl group having 2 to 10 carbon atoms, e.g., epoxidized soybean oil (commercially available products include Newcizer 510, produced by Nippon Oils & Fats Co., etc.); alkyl glycidyl ethers having the formula:

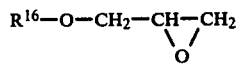

wherein $R^{16}$ is an alkyl group having 1 to 10 carbon atoms, e.g., methyl glycidyl ether, ethyl glycidyl ether, etc.; alkenyl glycidyl ethers having the formula:

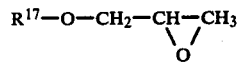

wherein $R^{17}$ is an alkenyl group having 2 to 10 carbon atoms and also containing therein one double bond, e.g., ally glycidyl ether; aryl glycidyl ethers having the formula:

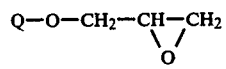

wherein Q is a phenyl group or an alkylphenyl group, e.g., phenyl glycidyl ether (commercially available under the trade name Epikote, products of Shell Chem. Co.); the epoxidized derivatives of alicyclic compounds having the formula:

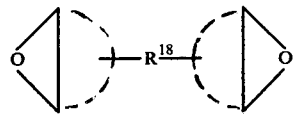

wherein $R^{18}$ represents a single bond or an alkylene or polymethylene group having 1 to 5 carbon atoms bonding the two alicyclic rings together, and the alicyclic rings bonded to $R^{18}$, which may be the same or different, each is a monovalent residue of an alicyclic compound having 5, 6 or 7 carbon atoms, the alicyclic rings being unsubstituted or substituted with an alkyl group having 1 to 5 carbon atoms (e.g., Chissonox-CX-221, produced by Chisso Co.); and the glycidyl ester of phthalic acid having the formula:

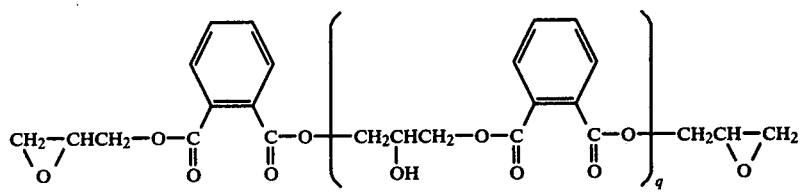

wherein q is 1 or 2 (e.g., Shodain-508, produced by Showa Denko Co.). These compounds may be used individually or in combination with each other. Although many of the above-described commercially available compounds have epoxy equivalent values between 100 and 200, the present invention is not limited to this range. Moreover, the effect of the epoxy compound in the present invention is relatively independent as to whether the compound is a solid or a liquid.

The characteristics of the above-described commercially available epoxy compounds which can be used in this invention are described more specifically in the table below.

| Epoxy Compound | Physical Form | Epoxy Equivalent* | Specific Gravity (Temperature) | Molecular Weight* |
|---|---|---|---|---|
| Epiol G-100 | Liquid | 150 | — | 300 |
| Newcizer-510 | Liquid | 300 | 0.989 (20° C.) | 1,000 |
| Epikote-828 | Liquid | 190 | — | 360–400 |
| Chissonox-CX-221 | Liquid | 140 | 1.170 (25° C.) | 250 |
| Shodain-508 | Liquid | 190 | 1.30 (25° C.) | 350 |
| Epocizer-W-128 | Liquid | 330 | 0.913 (25° C.) | 300 |

*The epoxy equivalent and molecular weight values generally vary to some extent. Thus, the values described in the table are average values.

Polymerizable ethylenically unsaturated monomers which can be used in the present invention as component (a) include acrylates and methacrylates (which are jointly the most preferred), polyacrylates and polymethacrylates of polyhydric alcohols, most preferably with 2 to 50 carbon atoms and 2 to 4 alcohol (hydroxy) groups (the terms "polyacrylates" and "polymethacrylates" mean di-, tri- and higher (e.g., up to about octa-) acrylates and methacrylates. Suitable examples of polyhydric alchol moieties are moieties derived from polyhydric alcohols such as polyethylene glycol, polypropylene oxide, polybutylene oxide, polycyclohexene oxide, poly(ethylenepropylene) oxide, polystyrene oxide, polyoxetane, polytetrahydrofuran, cyclohexane diol, xylylene diol, di(β-hydroxyethoxy)benzene, glycerin, diglycerin, neopentyl glycol, trimethylolpropane, triethylolpropane, pentaerythritol, dipentaerythritol, sorbitan, sorbitol, butanediol, butanetriol, 2-butene-1,4-diol, 2-butyl-2-ethylpropanediol, 2-butyne-1,4-diol, 3-chloro-1,2-propanediol, 1,4-cyclohexanedimethanol, 3-cyclohexene-1,1-dimethanol, decalindiol, 2,3-dibromo-2-butene-1,4-diol, 2,2-diethyl-1,3-propanediol, 1,5-dihydroxy-1,2,3,4-tetrahydronaphthalene, 2,5-dimethyl-2,5-hexanediol, 2,2-dimethyl-1,3-propanediol, 2,2-diphenyl-1,3-propanediol, dodecanediol, mesoerythritol, 2-ethyl-1,3-hexanediol, 2-ethyl-2-(hydroxymethyl)-1,3-propanediol, 2-ethyl-2-methyl-1,3-propanediol, heptanediol, hexanediol, 3-hexene-2,5-diol, hydroxybenzyl alcohol, hydroxyethyl resorcinol, 2-ethyl-1,4-butanediol, 2-methyl-2,4-pentanediol, nonanediol, octanediol, pentanediol, 1-phenyl-1,2-ethanediol, propanediol, 2,2,4,4-tetramethyl-1,3-cyclobutanediol, 2,3,5,6-tetramethyl-p-xylene-α,α'-diol, 1,1,4,4-tetraphenyl-1,4-butanediol, 1,1,4,4-tetraphenyl-2-butyne-1,4-diol, 1,2,6-trihydroxyhexane, 1,1'-bi-2-naphthol, dihydroxynaphthalene, 1,1'-methylenedi-2-naphthol, 1,2,4-benzenetriol, bisphenol, 2,2'-bis(4-hydroxyphenyl)butane, 1,1-bis(4-hydroxyphenyl)cyclohexane, bis(hydroxyphenyl)methane, catechol, 4-chlororesorcinol, 3,4-dihydroxyhydrocinnamic acid, hydroquinone, hydroxybenzyl alcohol, methylhydroquinone, methyl-2,4,6-trihydroxybenzoate, pyrogallol, resorcinol, glucose, α-(1-aminoethyl)-p-hydroxybenzyl alcohol, 2-amino-2-ethyl-1,3-propanediol, 2-amino-2-methyl-1,3-propanediol, 3-amino-1,2-propanediol, N-(3-aminopropyl)diethanolamine, N,N'-bis(2-hydroxyethyl)piperazine, 2,2-bis(hydroxymethyl)-2,2',2"-nitrilotriethanol, 2,2-bis(hydroxymethyl)propionic acid, 1,3-bis(hydroxymethyl)urea, 1,2-bis(4-pyridyl)-1,2-ethanediol, N-butyldiethanolamine, diethanolamine, N-ethyldiethanolamine, 3-mercapto-1,2-propanediol, 3-piperidino-1,2-propanediol, 2-(2-pyridyl)-1,3-propanediol, triethanolamine, α-(1-aminoethyl)-p-hydroxybenzyl alcohol and 3-amino-4-hydroxyphenyl sulfone. Further, acrylamides or methacrylamides, allyl derivatives, vinyl ethers, vinyl esters, N-vinyl compounds, styrene compounds, crotonic acid esters, and addition-polymerizable polyester methacrylates and acrylates can be also used as component (a) in the present invention.

More specifically, the polyester methacrylates or acrylates set forth above comprise the reaction product of the esterification between acrylic or methacrylic acid, one or more polycarboxylic acids having 2 to 50 carbon atoms, preferably 2 to 20 carbon atoms and 2 to 8 carboxyl groups, preferably 2 to 4 carboxyl groups and one or more polyhydric alcohols having 2 to 100 carbon atoms, preferably 2 to 50 carbon atoms and 2 to 8 hydroxy groups, preferably 2 to 6 hydroxy groups, having a structure presumed to be that of the general formula (II):

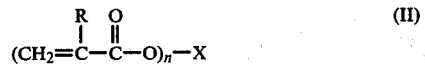

wherein R represents a hydrogen atom or a methyl group, X represents an ester residue containing at least one ester linkage and comprising a polyhydric alcohol and a polycarboxylic acid, and n is an integer of from 1 to 6.

Examples of polyhydric alcohols which can be used to form the ester residue X in the general formula (II) include, for example, ethylene glycol, 1,2-propylene glycol, 1,4-butanediol, 1,6-hexanediol, trimethylolpropane, trimethylolethane, 1,2,6-hexanetriol, glycerol, pentaerythritol, sorbitol and polyether polyols such as diethylene glycol, triethylene glycol, tetraethylene glycol, octaethylene glycol, tetradecaethylene glycol, dipropylene glycol, polypropylene glycol, etc.

On the other hand, polycarboxylic acids which can be used to form the ester residue X include, for example, aromatic polycarboxylic acids such as phthalic acid, isophthalic acid, terephthalic acid, tetrachlorophthalic acid, tetrabromophthalic acid, trimellitic acid, pyromellitic acid, benzophenone dicarboxylic acid, resorcinol diacetic acid, bisphenol A diacetic acid, unsaturated aliphatic polycarboxylic acids such as maleic acid, fumaric acid, himic acid, itaconic acid, saturated aliphatic polycarboxylic acids such as malonic acid, succinic acid, glutaric acid, adipic acid, pimeric acid, sebacic acid, dodecanoic acid, and unsaturated alicyclic polycarboxylic acids such as tetrahydrophthalic acid.

Preferred acrylic and methacrylic acid esters for component (a) include ethylene glycol diacrylate, diethylene glycol dimethacrylate, triethylene glycol diacrylate, tetraethylene glycol diacrylate, triethylene glycol dimethacrylate, tetraethylene glycol dimethacrylate, pentaerythritol triacrylate, pentaerythritol dimethacrylate, dipentaerythritol triacrylate, glycerol triacrylate, diglycerol dimethacrylate, 1,3-propanediol diacrylate, 1,2,4-butanetriol trimethacrylate, 1,4-cyclohexanediol diacrylate, 1,5-pentanediol diacrylate, neopentyl glycol diacrylate, the triacrylate of the ethylene oxide adduct of trimethylolpropane, etc.

A suitable amount of the polymerizable ethylenically unsaturated monomer which can be present in the photopolymerizable composition is about 20% to about 80% by weight, preferably 40% to 60%.

The photopolymerization initiator employed in the invention as component (b) is at least one of the compounds represented by the following general formula (I):

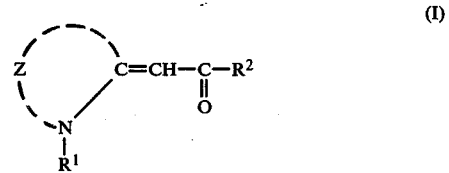

In the formula (I), $R^1$ represents a substituent which is usually used in cyanine dyes, including a lower alkyl group having 1 to 5 carbon atoms (such as methyl, ethyl, propyl, butyl, isopropyl, etc.), a hydroxyalkyl group (e.g., hydroxymethyl, 2-hydroxyethyl, 3-hydroxypropyl, etc.), an alkoxyalkyl group (e.g., 2-methoxyethyl, 2-ethoxyethyl, etc.), a carboxyalkyl group (e.g., carboxymethyl, 2-carboxyethyl, 3-carboxypropyl, etc.), a sulfoalkyl group (e.g., 2-sulfoethyl, 3-sulfopropyl, etc.) and an aralkyl group, which may be unsubstituted or substituted (e.g., benzyl, sulfobenzyl, carboxybenzyl, phenethyl, sulfophenethyl, carboxyphenethyl, etc.). $R^2$ represents a lower alkyl group having 1 to 5 carbon atoms (such as methyl, ethyl, propyl, butyl, isopropyl, etc.), an aryl group, which may be unsubstituted or substituted with a hydroxy group, an alkoxy group having 1 to 5 carbon atoms, a carboxyl group, an aralkyl group, a halogen atom or an amino group (e.g., preferably phenyl, p-hydroxyphenyl, p-methoxyphenyl, p-chlorophenyl, naphthyl, anthryl, etc.), or a univalent residue of an aromatic heterocyclic compound, which may be unsubstituted or substituted with an alkyl group having 1 to 5 carbon atoms or a halogen atom (e.g., chlorine, fluorine, bromine, iodine, etc.) (e.g., thienyl, benzothienyl, furyl, benzofuranyl, pyranyl, isobenzofuranyl, chromenyl, 2-H-pyrrolyl, pyridyl, pyrazinyl, pyrimidinyl, quinolyl, isoquinolyl, isoxazolyl, etc.). Z represents the non-metallic atoms necessary to complete a nitrogen-containing heterocyclic nucleus, which may include additional hetero atoms such as oxygen, sulfur and selenium, and which may be condensed with a benzene ring or a naphthalene ring, e.g., of the general formula (Ia):

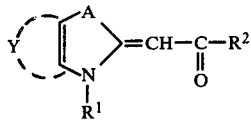

(Ia)

wherein A represents an oxygen atom, a sulfur atom or a selenium atom, Y represents the non-metallic atoms necessary to form a benzene ring, naphthalene ring, etc., and $R^1$ and $R^2$ have the same meaning as described for the general formula (I), for example, heterocyclic rings generally present in cyanine dyes, including, for example, benzothiazoline, naphthothiazoline, benzoselenazoline, naphthoselenazoline, benzoxazoline, naphthoxazoline, etc.

Specific examples of compounds represented by the general formula (I) given above include, for example, 2-benzoylmethylene-3-methyl-β-naphthothiazoline, 2-benzolymethylene-3-ethyl-β-naphthothiazoline, 3-ethyl-2-(2-thenoyl)-methylene-β-naphthothiazoline, 3-ethyl-2-propionylmethylene-β-naphthothiazoline, 5-chloro-3-ethyl-2-p-methoxybenzoylmethylenebenzothiazoline, etc.

The photopolymerization initiator can be present in the photopolymerizable composition within a range of from about 0.01 to about 20% by weight, and more preferably from 0.1 to 5% by weight, based on the weight of the monomer.

Chlorinated polyolefins which are used as a binder in the present invention are high molecular weight materials which are prepared by chlorination of a polyolefin. Methods of preparing chlorinated polyolefins are described in detail in Japanese Patent Publication 11190/1970, etc. Chlorinated polyolefins particularly suitable for use in the present invention include chlorinated polyethylene, chlorinated polypropylene and mixtures thereof. Chlorinated polyethylene which may be regarded as a relatively new industrial material has a number of superior characteristics in comparison with other conventional synthetic resin materials, such as weather-resistance, heat-resistance, inflammability, chemical resistance and ozone resistance. Chlorinated polypropylene has similar properties to chlorinated polyethylene. Both materials are generally available in the form of a white powder. The chlorinated polyolefin used in the present invention should preferably have a degree of polymerization between about 300 and about 20,000, and more preferably between 1,000 and 80,000.

A suitable chlorine content can range from about 30 to about 75, and more preferably from 60 to 73% by weight. As the chlorine content increases, the density of the resultant material increases and the solubilities thereof improve. The chlorine content also affects the softening point, maximum elongation, tensile strength, crystallinity and compatibilities with other resins, plasticizers, monomers and polymerization initiators. The chlorinated polyolefin used in the present invention should also have a specific gravity of about 1.55 to about 1.65 (at 25° C.) and a softening point of about 110° to about 130° C.

The photopolymerizable compositions of the present invention, which comprise principally the above-described components, can also contain a thermal polymerization inhibitor. Specific examples of suitable thermal polymerization inhibitors include, for example, p-methoxyphenol, hydroquinone, alkyl or aryl substituted hydroquinones, t-butylcatechol, pyrogallol, cuprous chloride, phenothiazine, chloranil, naphthylamine, β-naphthol, 2,6-di-t-butyl-p-cresol, pyridine, nitrobenzene, dinitrobenzene, p-toluidine, methylene blue, copper salts of organic acids such as copper acetate, etc. The thermal polymerization inhibitor can be present in the range of from about 0.001 to about 5 parts by weight per 100 parts by weight of the polymerizable monomer.

The photopolymerizable compositions of the present invention can contain other additives such as colorants, plasticizers, agents rendering the composition thixotropic, etc. Suitable colorants include, for example, various pigments such as carbon black, iron oxide, phthalocyanine derivatives, azo compounds, etc., and a number of dyes such as methylene blue, crystal violet, rhodamine B, fuchsin, auramine, azo dyes, anthraquinone dyes, etc. In selecting the colorant, care must be taken that the colorant used does not absorb light in the wavelength region where the photopolymerization initiator employed has a strong absorption. Such a colorant can be present in an amount of from about 0.1 to about 30 parts by weight, and more preferably from 0.1 to 3 parts by weight for the pigments, and from about 0.01 to about 10 parts by weight, and more preferably from 0.1 to 3 parts by weight for the dyes, respectively, based on 100 parts by weight of the total of the chlorinated polyolefin and the polymerizable monomer. Suitable plasticizers include phthalate esters such as dimethyl phthalate, diethyl phthalate, dibutyl phthalate, diisobutyl phthalate, dioctyl phthalate, etc., glycol esters such as dimethyl glycol phthalate, ethyl phthalyl ethyl glycolate, methyl phthalyl ethyl glycolate, butyl phthalyl butyl glycolate, triethylene glycol dicaprilate, etc., phosphates such as tricresyl phosphate, triphenyl phosphate, etc., triethyl citrate, glycerol triacetyl ester, butyl laurate, etc. Such a plasticizer can be present in an amount of from about 0.1% to about 20% by weight, preferably 1% to 10% by weight, based on the total weight of the photopolymerizable composition (i.e., the total weight of the components other than the solvent).

The photopolymerizable composition of the present invention is usually dissolved in a suitable solvent system to obtain a coating mixture, which is spread over a support material such as paper, a synthetic resin, a metal or supports comprising two or more of these materials in the form of a laminate.

Suitable solvent materials which can be used in preparing the coating mixture include ketones such as acetone, methyl ethyl ketone, methyl isobutyl ketone, cyclohexanone, diisobutyl ketone, etc., esters such as ethyl acetate, butyl acetate, amyl acetate, methyl formate, ethyl propionate, dimethyl phthalate, ethyl benzoate, etc., aromatic hydrocarbons such as toluene, xylene, benzene, ethylbenzene, etc., halogenated hydrocarbons such as carbon tetrachloride, trichloroethylene, chloroform, 1,1,1-trichloroethane, monochlorobenzene, chloronaphthalene, etc., ethers such as tetrahydrofuran, diethyl ether, ethylene glycol monoethyl ether acetate, ethylene glycol monomethyl ether, etc., dimethylformamide, dimethyl sulfoxide, etc.

Where the photopolymerizable composition of the present invention is used to produce a light-sensitive material in which the photosensitive coating is sandwiched between two supporting materials, at least one of the supports must transmit light well which causes a photopolymerization of the composition to occur and have a surface of high uniformity. More precisely, such a transparent support should have light transmittance not less than about 30% at the wavelength range between about 290 and about 500 nm, and more preferably not less than about 65% and a uniform surface. Suitable support materials include polyethylene terephthalate, polypropylene, polyethylene, cellulose triacetate, cellulose diacetate, polyvinyl chloride, polyvinyl alcohol, polycarbonates, polystyrene, regenerated celluloses, vinylidene chloride copolymers, polyamides (e.g., 6-nylon, 6,6-nylon, 6,10-nylon, etc.), polyimides, vinyl chloride/vinyl acetate copolymers, polytetrafluoroethylene, polytrifluoroethylene, etc. Further, supports comprising two or more of these materials laminated together can be used. Where the photopolymerizable composition of the present invention is provided on a single support as a thin coating, still other materials can be used as supports, including paper, metals, opaque synthetic resin films, composites of these materials, or laminates comprising two or more of these materials.

The thickness of the support is not limited to any particular range, although a thickness between about 10 and about 150 microns, and more preferably between 10 and 50 microns, is usually used. A suitable coating amount of the photopolymerizable composition which can be coated is about 1 to about 100 g, preferably 1.5 to 70 g, of the photopolymerizable composition of this invention per m² of the support.

For an even better understanding of the present invention, some specific examples thereof are given below. In the following examples, the CI numbers refer to the Constitution Numbers as defined in *Color Index*, Third Edition, The Society of Dyers and Colourists, Bradford, Yorkshire, England and the American Association of Textile Chemists and Colorists, Research Triangle Park, North Carolina, U.S.A. Further, unless otherwise indicated herein, all parts, percents, ratios and the like are by weight.

EXAMPLE 1

A photopolymerizable composition comprising the following components was prepared:

| | |
|---|---|
| Chlorinated Polyethylene (CPE-907 LTA, a product of Sanyo-Kokusaku Pulp Co.; chlorine content: 66% by weight; viscosity of 40% by weight toluene solution at 25° C.: about 90 cps) | 50 g |
| Trimethylolpropane Triacrylate | 40 g |
| 2-Benzoylmethylene-3-methyl-β- | 0.5 g |
| naphthothiazoline | |
| Azo Pigment (Microlith Red-RT, a product of Ciba-Geigy Ltd.; C.I. No. 12120 | 0.1 g |
| p-Methoxyphenol | 0.2 g |

Coating Mixture Solution (A) was prepared by dissolving the above components into 300 ml of methyl ethyl ketone. Separately, Coating Mixture Solution (B) was prepared by adding 10 g of Epocizer W-128 (produced by Dai-Nippon Ink Chem. Ind. Ltd., mainly consisting of epoxidized butyl oleate; $D_4^{25}=0.913$; refractive index $n_d^{25}=1.455$; melting point $=15°$ C.) to a mixture having the same composition as Coating Mixture Solution (A). Each of these two mixtures was uniformly coated on an anodized aluminum plate with a thickness of 0.24 mm by means of a whirler, and the coated plate was heated at 80° C. for 15 minutes. The thickness of the dried coating was 2 microns. The resultant photosensitive materials are designated Plate (A), and Plate (B), respectively. Each plate was image-wise exposed to an optically negative original containing letter information with a vacuum printer equipped with a 2 KW high-pressure mercury lamp. The distance between the plate and the light source was 55 cm and the exposure time was 30 seconds. The exposed plate was subjected to spray development with a 2:1 by volume mixture of methanol and methyl ethyl ketone whereby the unhardened areas of the photosensitive coating were removed. Both plates gave a clear and distinct positive image. Each image exhibited an acceptable level of oleophilicity and accepted printing ink well during press operation.

Next, the storage stabilities of Plates (A) and (B) were compared as to photographic speed and half-tone screen line resolution after the plates were kept at 50° C. The results obtained are shown in the following table.

| | Sample | | | |
|---|---|---|---|---|
| Period of Storage at 50° C. (weeks) | Plate (A) Resulting from Coating Mixture Solution (A) | | Plate (B) Resulting from Coating Mixture Solution (B) | |
| | Speed[1] | Screen Line[2] Number | Speed | Screen Line Number |
| 1 | 8 | 133 | 8 | 133 |
| 2 | 8 | 133 | 8 | 133 |
| 3 | 8 | 133 | 8 | 133 |
| 4 | 9 | 120 | 8 | 133 |
| 5 | 10 | 100 | 8 | 133 |

[1] Number of steps which remained on the plate when the plate was exposed through an optical step wedge with a step optical density difference of 0.15 with a 2 kw high pressure mercury lamp at a distance of 55 cm for 30 sec.
[2] Half-tone screen image expressed in terms of lines/inch which were clearly discernible on the plate exposed to a test pattern comprising screen images with different line densities under the same exposure conditions as in the test for photographic speed (1) above.

The values illustrated above demonstrate that with Plate (A) the effect of dark reaction was observed after storage for four weeks, while with Plate (B), no substantial change was observed even after five weeks of storage.

EXAMPLE 2

A photopolymerizable composition as described below was prepared:

| | |
|---|---|
| Chlorinated Polypropylene (CPP-406, | 20 g |

-continued

| | |
|---|---|
| produced by Sanyo-Kokusaku Pulp Co.; chlorine content: about 68% by weight; viscosity of 40% by weight toluene solution at 25° C.: about 50 cps) | |
| Pentaerythritol Triacrylate | 30 g |
| 3-Ethyl-2-propionylmethylene-$\beta$-naphthothiazoline | 0.3 g |
| Methylene Blue | 0.1 g |
| Hydroquinone | 0.1 g |

Of these components, Methylene Blue was dissolved in 1 ml of ethanol, and the others were dissolved in 50 ml of trichloroethylene. The two solutions were mixed to obtain a viscous, colored photosensitive Coating Mixture Solution (C). Separately, another Coating Mixture Solution (D) was prepared by adding 2 g of Epiol G-100 (a product of Nippon Oils & Fats Co., and mainly comprising glycerol glycidyl ether; density at 20° C. = 1.23 g/cm$^3$) to the mixture having the same composition as Coating Mixture Solution (C). 10 ml of each coating mixture solution was put in a glass tube, which was sealed air-tight with a 25 micron-thick polyethylene film. The thermal stabilities of these solutions were compared by placing the sealed tubes in an air bath kept at 80° C. In Coating Mixture Solution (C), polymerization of the monomer started gradually in 6 hours and in another hour the entire volume had solidified as the result of polymerization, while, on the other hand, the viscosity of Coating Mixture Solution (D) began to increase after 10 hours of heating. This tendency continued for the next 5 hours of heating, but not resulting in solidification. This comparison definitely shows that Epiol G-100 in Coating Mixture Solution (D) effectively prevents thermal polymerization of the monomer involved.

EXAMPLE 3

Two Coating Mixture Solutions (C) and (D) prepared as described in Example 2 were spread over a support comprising a 25 micron-thick polyethylene terephthalate film superimposed with a nylon screen. After 10 minutes of drying at 70° C., another sheet of a polyethylene terephthalate film was laminated thereon so as to produce a structure in which the photosensitive composition and the nylon screen were sandwiched between the two film supports. Each material was designated Materials (C) and (D), respectively. The thickness of the photosensitive layer after dyring was about 100 microns including the nylon screen. Then, each material was exposed for 1 minute to an optically positive image in a contact exposure device (PLANO PS-PRINTER-A3, manufactured by Fuji Photo Film Co.) provided with nine 20 W fluorescent lamps. In the device, the distance between the material and the light source was 5 cm. The two polyethylene terephthalate film supports were then stripped off whereby at the unexposed areas the photosensitive coating was removed together with the supports, while the light-cured coating at the exposed areas remained on the nylon screen. The nylon screen carrying the image pattern thus-prepared could be utilized as a printing master for mimeograph as such.

The thermal stabilities of these Materials (C) and (D) were compared by placing the materials in an oven kept at 100° C. In 5 hours, thermal polymerization occurred with Material (C) completely to such a degree that it could not be used as a photosensitive material. On the other hand, Material (D) could be used as photosensitive mimeograph plate even after 10 hours showing only a slight polymerization progress.

EXAMPLE 4

Coating Mixture Solution (E) of the following photopolymerizable composition was prepared.

| | |
|---|---|
| Chlorinated Polyethylene (Adekaprene CE-505, a product of Asahi Denka Ind. Ltd.) | 20 g |
| Glycerol Triacrylate | 20 g |
| 1-Methyl-2-benzoylmethylene-$\beta$-naphthothiazoline | 0.4 g |
| p-Methoxyphenol | 0.2 g |
| Blue Pigment (Microlith blue 4GA*, a product of Ciba-Geigy) | 0.1 g |
| Methyl Ethyl Ketone | 100 ml |

*a phthalocyanine pigment, C.I. number 74160

Another Coating Mixture Solution (F) was prepared by adding 5 g of DAIMAC S-300K (available from Daicel Co., the principal ingredient being epoxidized soybean oil; density at 25° C.: 0.992 g/cm$^3$; refractive index $n_D{}^{25}$ = 1.470; ester value: 180) to the solution of the same composition as described for Coating Mixture Solution (E). A part of each solution was coated on a 25 micron-thick polyethylene terephthalate film using a coating rod to produce a coating thickness of 15 microns on dry basis. Drying was carried out at 80° C. for 20 minutes. The resultant materials were designated Materials (E) and (F), respectively. Each coated material was then laminated under pressure onto a cleaned copper board for a printed circuit in such a manner that the coated layer was in contact with the copper surface. The exposure was carried out with a 2 KW high pressure mercury lamp at a distance of 55 cm for 1 minute using an optically negative image containing an electric circuit lamp therein. The polyethylene terephthalate film covering the coating was removed immediately after the exposure whereby the light-cured coating remained in the form of the corresponding positive image on the copper board in either of Material (E) or (F). Unhardened areas were removed together with the cover film.

A thermal stability test was carried out on samples comprising a cover film of cellulose triacetate with a thickness of 38 microns and either of the coating for Material (E) or (F) which was kept in a 50° C. oven. Sample (E) became inoperable for use by thermal polymerization in five weeks, while Sample (F) withstood storage for eight weeks.

EXAMPLE 5

Coating Mixture Solution (G) of the following photopolymerizable composition was prepared.

| | |
|---|---|
| Polyester Acrylate (Aronix M-8060, a product of Toa Gosei Chem. Ind. Ltd.) | 100 g |
| Chlorinated Polyethylene (CPE-907HA, a product of Sanyo-Kokusaku Pulp Co.; chlorine content: about 69% by weight; viscosity of 35% by weight toluene solution at 25° C.: about 380 cps) | 80 g |
| 2-Benzoylmethylene-3-ethyl-$\beta$-naphthothiazoline | 0.5 g |
| Blue Pigment (Microlith Blue 4 GT, a product of Ciba-Geigy Ltd.) | 0.5 g |
| Aerosil-380 (a product of Japan Aerosil Co.; comprising SiO$_2$ with a purity not lower than 99%, having a specific surface area of about 380 m$^2$/g, the | 10 g |

| -continued | |
|---|---|
| chemical structure being identified as colloidal anhydrous silicic acid) | |
| Toluene | 200 ml |

Another Coating Mixture Solution (H) was prepared by adding to the above composition 8 g of glycerin glycidyl ether (Epiol G-100) described hereinbefore in Example 2. In order to compare the stabilities of these solutions at elevated temperature, 30 ml of each solution was taken in a glass tube, which was sealed with a thin polyethylene terephthalate film. The sealed tube was placed in an air oven kept at 100° C. After 5 hours of storage, Coating Mixture Solution (G) completely solidified due to thermal polymerization, while Coating Mixture Solution (H) exhibited a slight increase of viscosity after 10 hours, polymerization being completed in another hour.

This result also clearly demonstrates the advantageous effect of glycerin glycidyl ether.

EXAMPLE 6

Each of the coating mixture solutions prepared in Example 5, designated (G) and (H), was coated on a 25 micron-thick polyethylene terephthalate film support using a coating rod. After 15 minutes drying at 80° C., the coating thickness was 20 microns. The photosensitive materials thus-prepared were designated Materials (G) and (H), respectively. Each material was laminated under application of pressure onto a cleaned copper board for use in a printed circuit. A circuit pattern was exposed to the material using an optically negative original and a 2 KW high pressure mercury lamp with a distance of 55 cm for 1 minute. Upon stripping off the polyethylene terephthalate film, a corresponding positive image of the light-cured layer was formed on the copper board, and the uncured portions were removed together with the polyethylene terephthalate film by delamination (or peeling-off) of the polyethylene terephthalate film. The copper board bearing a pattern thereon was subjected to an etching operation using a 40% by weight ferric chloride aqueous solution kept at 40° C. During etching, both of the photopolymerized coatings resulting from Material (G) or (H) perfectly withstood the etchant, adhering firmly to the copper surface and having no tendency of stripping nor pinhole generation.

Then, the two materials were kept at an elevated temperature in order to compare the degree of thermal polymerization. The materials were placed in an oven kept at 50° C. in light-tight condition. After varied intervals, a part of the material was subjected to the positive image forming processing described in Example 1 above. For the first 20 days, no difference was observed between the two materials and they provided acceptable quality images. After 30 days, a small number of breaks were observed in the circuit pattern for Material (G), suggesting some dark polymerization had occurred. In 40 days, the whole volume of the coating of Material (G) polymerized thermally and no image was obtained on the copper board. On the contrary, Material (H) could still give a clear and distinct image at this point (after 40 days of storage at 50° C.).

This comparison also discloses definitely the high efficiency of glycerin glycidyl ether on the suppression of thermal polymerization of photopolymerizable compositions of the present invention, and on the improvement in the thermal stability thereof.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition consisting essentially of (a) about 20% to 80% by weight of a polymerizable ethylenically unsaturated monomer, (b) about 0.01 to about 20% by weight of a photopolymerization initiator, for (a), represented by the general formula (I):

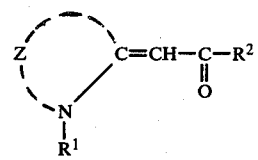

wherein Z represents the non-metallic atoms necessary to complete a nitrogen-containing heterocyclic nucleus; $R^1$ represents an alkyl group; and $R^2$ represents an alkyl group, an aryl group or a thienyl group; and (c), in an amount sufficient to function as a binder, a chlorinated polyolefin the improvement comprising said composition including (d), as a thermal stabilizer, about 1 to about 30% by weight based on the composition of a compound having at least one epoxy group and having an epoxy equivalent ranging from about 100 to about 1000.

2. The photopolymerizable composition of claim 1, wherein said compound having at least one epoxy group (d) is an epoxidized aliphatic mono ester having the formula:

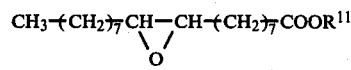

wherein $R^{11}$ is an alkyl group having up to 10 carbon atoms; a polyglycidyl ether of a polyhydric alcohol having the formula:

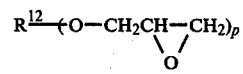

wherein p is an integer of 2 to 6 and $R^{12}$ is a divalent to hexavalent residue of a polyol; an epoxidized triglyceride having the formula:

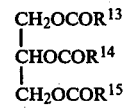

wherein $R^{13}$, $R^{14}$ and $R^{15}$, which may be the same or different, are each an epoxidized alkyl group having 2 to 10 carbon atoms; an alkyl glycidyl ether having the formula:

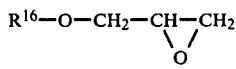

wherein R[16] is an alkyl group having 1 to 10 carbon atoms; an alkenyl glycidyl ether having the formula:

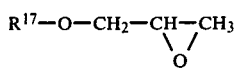

wherein R[17] is an alkenyl group having 2 to 10 carbon atoms and also containing therein one double bond; an aryl glycidyl ether having the formula:

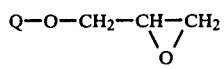

wherein Q is a phenyl group or an alkylphenyl group; an epoxidized alicyclic compound having the formula:

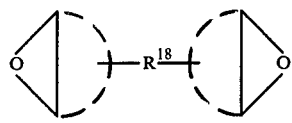

wherein R[18] represents a single bond or an alkylene or polymethylene group having 1 to 5 carbon atoms bonding the two alicyclic rings together, and the alicyclic rings bonded to R[18], which may be the same or different, each is a monovalent residue of an alicyclic compound having 5, 6 or 7 carbon atoms, the alicyclic rings being unsubstituted or substituted with an alkyl group having 1 to 5 carbon atoms; or a glycidyl ester of phthalic acid having the formula:

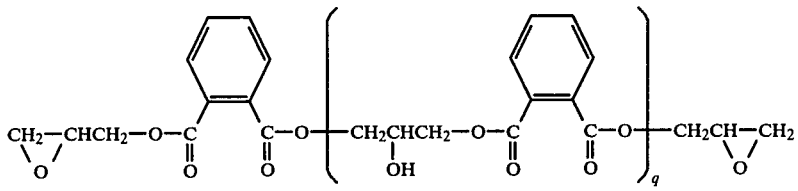

wherein q is 1 or 2.

3. The photopolymerizable composition of claim 1, wherein said polymerizable ethylenically unsaturated monomer is an acrylate or a methacrylate, an acrylamide or methacrylamide, an allyl compound, a vinyl ether, a vinyl ester, an N-vinyl compound, a styrene compound, a crotonic acid ester or an addition-polymerizable polyester methacrylate or acrylate.

4. The photopolymerizable composition of claim 1, wherein said polymerizable ethylenically unsaturated monomer (a) has the general formula (II):

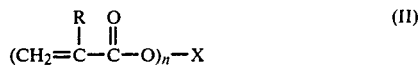

wherein R represents a hydrogen atom or a methyl group, X represents an ester residue containing at least one ester linkage and comprising an ester of a polyhydric alcohol and a polycarboxylic acid, and n is an integer of from 1 to 6.

5. The photopolymerizable composition of claim 1, wherein R[1] is a lower alkyl group having 1 to 5 carbon atoms, an alkoxyalkyl group, a carboxyalkyl group, a sulfoalkyl group or an aralkyl group; R[2] is a lower alkyl group having 1 to 5 carbon atoms, an aryl group or a univalent residue of an aromatic heterocyclic compound; and Z forms a benzothiazoline nucleus, a naphthothiazoline nucleus, a benzoselenazoline nucleus, a naphthoselenazoline nucleus, a benzoxazoline nucleus or a naphthoxazoline nucleus.

6. The photopolymerizable composition of claim 1, wherein said photopolymerization initiator (b) represented by the general formula (I) is 2-benzoylmethylene-3-methyl-β-naphthothiazoline, 2-benzoylmethylene-3-ethyl-β-naphthothiazoline, 3-ethyl-2-(2-thenoyl)-methylene-β-naphthothiazoline, 3-ethyl-2-propionylmethylene-β-naphthothiazoline or 5-chloro-3-ethyl-2-p-methoxybenzoylmethylenebenzothiazoline.

7. The photopolymerizable composition of claim 1, wherein said chlorinated polyolefin binder (c) is chlorinated polyethylene, chlorinated polypropylene or a mixture thereof.

8. The photopolymerizable composition of claim 1, wherein said chlorinated polyolefin binder (c) is a chlorinated polyolefin having a degree of polymerization between about 300 and about 20,000 and a chlorine content ranging from about 30 to about 75% by weight.

9. The photopolymerizable composition of claim 1, wherein said composition additionally contains a thermal polymerization inhibitor, a colorant, and/or a plasticizer.

10. A photosensitive element comprising a support having thereon a layer of the photopolymerizable composition of claim 1.

* * * * *